United States Patent [19]

Yano et al.

[11] Patent Number: 5,164,460
[45] Date of Patent: Nov. 17, 1992

[54] POLYIMIDE COMPOSITE MATERIAL AND PROCESS FOR PRODUCING THE SAME

[75] Inventors: Kazuhisa Yano; Arimitsu Usuki; Akane Okada; Toshio Kurauchi, all of Aichi, Japan

[73] Assignee: Kabushiki Kaisha Toyota Chuo Kenkyusho, Aichi, Japan

[21] Appl. No.: 707,905

[22] Filed: May 30, 1991

[30] Foreign Application Priority Data

May 30, 1990 [JP] Japan .................. 1-140372

[51] Int. Cl.$^5$ .................. C08J 5/10; C08K 3/34; C08L 33/24
[52] U.S. Cl. .................. 524/445; 524/447; 524/448
[58] Field of Search .............. 524/493, 494, 445, 447, 524/448

[56] References Cited

U.S. PATENT DOCUMENTS

| | | | |
|---|---|---|---|
| 4,739,007 | 4/1988 | Okada et al. | 524/789 |
| 4,775,586 | 10/1988 | Bohrn et al. | 524/449 |
| 4,810,734 | 3/1989 | Kawasumi et al. | 524/714 |
| 4,889,885 | 12/1989 | Usuki et al. | 524/445 |

*Primary Examiner*—Paul R. Michl
*Assistant Examiner*—U. K. Rajguru
*Attorney, Agent, or Firm*—Oblon, Spivak, McClelland, Maier & Neustadt

[57] ABSTRACT

Disclosed herein is a polyimide composite material which comprises a polyimide-containing resin and a layered clay mineral which is intercalated with organic onium ions and dispersed in the polyimide. Owing to the intercalated clay mineral, the composite material has improved gas and water vapor barrier properties and a small thermal expansion coefficient. Disclosed also herein is a process for producing a polyimide composite material which comprises the steps of intercalating a layered clay mineral with organic onium ions, adding by mixing the intercalated clay mineral to a solution of a monomer or prepolymer for polyimide, removing the solvent, and forming a polyimide. This process makes the layered clay mineral miscible with and dispersible in polyimide.

20 Claims, No Drawings

POLYIMIDE COMPOSITE MATERIAL AND PROCESS FOR PRODUCING THE SAME

BACKGROUND OF THE INVENTION

1. Field of the Invention

The present invention relates to a polyimide composite material and a process for producing the same, and more particularly, it is concerned with a polyimide composite material which is composed of a polyimide-containing resin (hereinafter referred to as a polyimide resin) and a layered clay mineral dispersed therein and has improved water and gas barrier properties, and also with a process for producing the same.

2. Description of the Related Art

Polyimide is suitable for use as film, flexible printed circuit board, motor insulator, wire covering, etc. on account of its outstanding thermal properties, mechanical properties, electrical insulating properties, and chemical resistance. However, it poses a problem associated with practical use because of its poor gas (and water vapor) barrier properties and high coefficient of thermal expansion.

This problem has been addressed by introducing a fluorinated monomer into the molecule (as disclosed in Japanese Patent Laid-open Nos. 60933/1990 and 60934/1990) or by incorporating an inorganic substance (as such) into polyimide. To address a similar problem involved in polyamide resins, there has been proposed a composite material composed of a polyamide resin and a layered clay mineral dispersed therein which has previously been intercalated with an organic compound (U.S. Pat. No. 4,739,007).

The approach to solution by the aid of fluorinated monomer is not of practical value because of its high price. The mere incorporation of an inorganic substance (as such) into a polyimide resin ends up with incomplete dispersion due to their poor affinity, without achieving the improvement in gas barrier properties as intended, and a film formed of such composite material will lack the surface smoothness.

The technology of the polyamide composite material mentioned above cannot be applied to polyimide because of their difference in affinity for solvents. In other words, polyimide is produced by polymerization in a special solvent (i.e., aprotic polar solvent), and a clay mineral intercalated with organic compound usually has a weak affinity for such a special solvent. For this reason, a clay mineral does not disperse well in a polyimide.

There are disclosed in U.S. Pat. No. 4,775,586 composites and construction materials which are composed of a polyimide and a flocculant of intercalated clay formed by the reaction of a layered clay mineral with organic dionium ions. This patented invention is intended for flocculation rather than dispersion of intercalated clay into a polyimide resin. Therefore, this polyimide composite material does not have good gas and water barrier properties.

SUMMARY OF THE INVENTION

The gist of the present invention resides in a polyimide composite material which comprises a polyimide-containing resin (referred to as a polyimide resin) and a layered clay mineral intercalated with organic onium ions and dispersed in the polyimide. As a layered clay mineral is intercalated with organic onium ions, it has an affinity for the polyimide. The gist of the present invention resides also in a process for producing a polyimide composite material which comprises the steps of intercalating a layered clay mineral with organic onium ions, adding by mixing the intercalated product to a solution of a monomer or prepolymer for polyimide, removing the solvent, and forming a polyimide.

Other and further objects, features, and advantages of the present invention will appear more fully from the following description.

DETAILED DESCRIPTION OF THE INVENTION

The present invention is embodied in a polyimide composite material which comprises a polyimide resin and a layered clay mineral dispersed therein which is intercalated with organic onium ions.

The polyimide composite material has good gas and water vapor barrier properties because it contains the layered clay mineral dispersed therein which physically prevents the diffusion of oxygen and water in the composite material. Therefore, it is suitable for use as a raw material for electrical insulation and printed circuit boards. It protects metal parts from oxidation and electrolytic corrosion by permeating oxygen and water vapor.

The polyimide composite material retains the polyimide's inherent properties heat stability, mechanical strength, and chemical resistance, despite the layered clay mineral it contains. As a whole, it is superior to a polyimide resin used alone.

The polyimide composite material gives rise to a molded product having a good dimensional stability owing to the layered clay mineral which represses thermal expansion. It also gives rise to a film having a smooth surface owing to the layered clay mineral which is uniformly dispersed.

A polyimide-containing resin referred to as "polyimide resin" in the present invention includes all polyimide resins known and blends of a polyimide resin with other resins.

"Organic onium ions" as used in the present invention denotes organic compounds having an onium ion at one terminal of the main chain. Examples of the onium ion include monoammonium ion, monopyridinium ion, monophosphonium ion, and monosulfonium ion. The main chain may be a straight or branched carbon chain; it may have a ring structure in part thereof. The other terminal of the main chain may have a hydrogen atom or a group (or a derivative thereof) such as hydroxyl group, amino group, carboxyl group, nitro group, and sulfone group. The main chain should preferably have 6 or more carbon atoms so that the organic onium ion expands the interlayer distance of the clay to such an extent that the layered clay mineral is sufficiently dispersed. However, the main chain should preferably have less than 20 carbon atoms so that the organic onium ion has a good affinity for protic polar solvents (e.g., water) and aprotic polar solvents. Preferred examples of the organic onium ion are alkylammonium ions such as laurylamine ion, myristylamine ion, palmitylamine ion, and stearylamine ion.

"Layered clay mineral" as used in the present invention includes smectite clay minerals (such as montmorillonite, saponite, beidellite, hectorite, and stevensite), vermiculite, halloysite, and swellable mica. (Swellable mica collected by decantation is readily dispersible in water, and it leads itself to a good polyimide composite material even at as low a content as 0.01 wt %.) The layered clay mineral should preferably have a cation exchange capacity (CEC) of 50–300 meq/100 g and also have a large contact area for the polyimide or monomer to which it is added. With a CEC greater than 300 meq/100 g, the layered clay mineral has such a strong layer bond strength that it presents difficulties in the expansion of the layer distance and hence it does not disperse well in the polyimide. With a CEC smaller than 50 meq/100 g, the layered clay mineral absorbs the organic onium ion only insufficiently and hence lacks affinity for the polyimide. It is desirable that the layered clay mineral be crushed to a desired shape before use by means of a mixer, mill, mortar, and the like, to facilitate its complete dispersion.

The intercalation of a layered clay mineral with organic onium ions is based on the replacement of exchangeable inorganic ions in the layered clay mineral by the organic onium ions. The ratio (by weight) of the organic onium ions to the layered clay mineral is not specifically restricted; however, the amount of the organic onium ions should be large enough for the complete replacement of the exchangeable inorganic ions.

The composite material of the present invention should be composed of 50–99.99 parts by weight of polyimide and 0.01–50 parts by weight of layered clay mineral containing organic onium ions. If the amount of polyimide is less than 50 parts by weight and the amount of intercalated clay mineral is more than 50 parts by weight, the resulting composite material is poor in mechanical properties and surface smoothness. If the amount of intercalated clay mineral is less than 0.01 part by weight, the resulting composite material does not have improved properties.

"Dispersion" of layered clay mineral in polyimide is defined as a state of dispersion in which the layered clay mineral is divided into individual unit layers at the molecular level. To be more specific, the state of dispersion is such that more than 50%, preferably more than 70%, of the layered clay mineral is dispersed without forming a mass, with individual layers or groups of less than 5 layers (on average) orienting parallel to one another or randomly or both. When the composite material is formed into a film, the layered clay mineral is oriented in the direction parallel to the film surface, which contributes to barrier properties.

The composite material of the present invention may further include one or more optional resins such as polyetherether ketone, polysulfone, and polyamideimide for the control of desired physical properties. It may be further incorporated with pigments and dyes, reinforcements and fillers (such as glass fiber, metal fiber, metal flake, and carbon fiber), heat stabilizers, antioxidants, UV light absorbers, light stabilizers, lubricants, plasticizers, antistatic agents, and flame retardants according to the intended use.

The present invention is also embodied in a process for producing a polyimide composite material which comprises the steps of reacting a layered clay mineral with organic onium ions, thereby giving an intercalated clay mineral, adding by mixing the intercalated clay mineral to a solution of a monomer or prepolymer for polyimide, removing the solvent from the solution, and forming a polyimide.

The process of the present invention starts with intercalation of a layered clay mineral with organic onium ions. The intercalation expands the layer distance of the layered clay mineral, thereby enabling the layered clay mineral to take polymer molecules into the space between layers. Moreover, the layered clay mineral is given by the organic onium ions an affinity for a solution of a monomer or prepolymer for polyimide. As the result, the intercalated clay mineral is mixed well with a monomer or prepolymer for polyimide. After the completion of polymerization, there is obtained a polyimide composite material in which the layered clay mineral is thoroughly dispersed.

The same definitions as given earlier are also applied to those terms "layered clay mineral", "organic onium ions", and "intercalated clay mineral" which are used to explain the process of the present invention.

No restrictions are placed on the process of preparing a layered clay mineral containing organic onium ions. A typical process consists of mixing a layered clay mineral with organic onium ions in a neat or mixed solvent selected from water, methanol, ethanol, propanol, isopropanol, ethylene glycol, 1,4-butanediol, and glycerin. A preferred solvent for montmorillonite is water, methanol, or ethanol, or a mixture of two or more of them.

According to the present invention, the process should employ a protic polar solvent such as water and alcohol. It is only this solvent which permits the good dispersion of layered clay mineral. This solvent is also a good one for the organic onium ion.

The organic onium ion used in the present invention should preferably be an alkyl onium ion which has less than 20 carbon atoms in the main chain. However, for the sufficient expansion of the layer distance of the layered clay mineral, it is desirable that the main chain of the organic onium ion have 6 or more carbon atoms.

The polyimide in the present invention is produced from any dianhydride and diamine which are known as monomers for polyimide. Examples of the dianhydride include pyromellitic dianhydride, 3,3', 4,4'-biphenyltetracarboxylic dianhydride, and 3,3', 4,4'-benzophenonetetracarboxylic dianhydride. Examples of the diamine include 4,4'-diaminodiphenyl ether, 3,4'-diaminodiphenyl ether, and p-phenylenediamine. They may be used alone for homopolymerization or in combination with one another for copolymerization. They may be copolymerized with a dicarboxylic acid and a diol or their respective derivatives to give polyamideimide, polyesteramideimide, or polyesterimide.

The polyimide in the present invention is also produced from a prepolymer which is exemplified by poly(amic acid). Usually, a polyimide resin cannot be mixed in its molten state with the intercalated clay mineral because it decomposes at a temperature lower than the temperature at which it begins to flow. But, if the temperature of fluidization is lower than that of decomposition, the polyimide composite material can be produced by this melt-mixing method.

The dispersion of the intercalated clay mineral is effected by the aid of an aprotic polar solvent which is commonly used for the production of polyimide. Examples of this solvent include N,N-dimethylacetamide, N-methylpyrrolidone, N,N-dimethylformamide, and 1,3-dimethylimidazolidinone and the like. They are only solvents which dissolve the monomer and prepolymer for polyimide. These solvents are miscible also with the organic onium ion and hence with the intercalated clay mineral. Therefore, these solvents permit intimate mixing (at the molecular level) of the monomer or prepolymer for polyimide with the intercalated clay mineral.

EXAMPLES

The invention will now be explained with reference to the following examples. The polyimide composite material was evaluated by measuring water vapor permeability, oxygen permeability, and thermal expansion coefficient according to ASTM. The film prepared from the polyimide composite material was rated as good or poor according to the visual inspection of the external appearance.

Preparation of Solution (A-1)

A solution of poly(amic acid) was prepared by completely dissolving 52.4 g of 4,4'-diaminodiphenyl ether in 516 g of dimethylacetamide and then adding to the solution 57.0 g of pyromellitic dianhydride.

Preparation of Solution (A-2)

A solution of poly(amic acid) was prepared by completely dissolving 28.3 g of p-phenylenediamine in 700 g of dimethylacetamide and then adding to the solution 76.9 g of biphenyltetracarboxylic dianhydride.

Preparation of Organophilic Clay (B-1)

In 3 liters of water was dispersed 100 g of montmorillonite (from Yamagata Prefecture) having a cation-exchange capacity of 119 meq/100 g. To the dispersion was added 51.2 g of 12-aminododecanoic acid and 24.1 g of conc. hydrochloric acid (36%), followed by stirring at room temperature for 60 minutes. After thorough rinsing, the intercalated montmorillonite including water was separated by filtration under reduced pressure using a Buchner funnel. The intercalated montmorillonite including water was freeze-dried to remove the water. Thus, intercalated montmorillonite containing ammonium ion of 12-aminododecanoic acid was given. Finally, it was dispersed in 4.5 kg of dimethylacetamide.

Preparation of Organophilic Clay (B-2)

In 3 liters of water was dispersed 100 g of montmorillonite (from Yamagata Prefecture) having a cation-exchange capacity of 119 meq/100 g. To the dispersion was added 44.1 g of laurylamine and 24.1 g of conc. hydrochloric acid (36%), followed by stirring at room temperature for 60 minutes. After thorough rinsing, the intercalated montmorillonite including water was separated by filtration under reduced pressure using a Buchner funnel. The intercalated montmorillonite including water was freeze-dried to remove the water. Thus, intercalated montmorillonite containing ammonium ion of laurylamine was given. Finally, it was dispersed in 4.5 kg of dimethylacetamide.

Preparation of Organophilic Clay (B-3)

In 3 liters of water was dispersed 100 g of swellable mica having a cation-exchange capacity of 234 meq/100 g. To the dispersion was added 88.2 g of laurylamine and 48.2 g of conc. hydrochloric acid (36%), followed by stirring at room temperature for 60 minutes. After thorough rinsing, the intercalated mica including water was separated by filtration under reduced pressure using a Buchner funnel. The intercalated mica including water was freeze-dried to remove the water. Thus, intercalated swellable mica containing ammonium ion of laurylamine was given. Finally, it was dispersed in 4.5 kg of dimethylacetamide.

Preparation of Organophilic Clay (B-4)

In 3 liters of water was dispersed 100 g of synthetic saponite having a cation-exchange capacity of 119 meq/100 g. To the dispersion was added 44.1 g of laurylamine and 24.1 g of conc. hydrochloric acid (36%), followed by stirring at room temperature for 60 minutes. After thorough rinsing, the intercalated saponite including water was separated by filtration under reduced pressure using a Buchner funnel. The intercalated saponite including water was freeze-dried to remove the water. Thus, intercalated synthetic saponite containing ammonium ion of laurylamine was given. Finally, it was dispersed in 4.5 kg of dimethylacetamide.

Preparation of Organophilic Clay (B-5)

In 90 liters of water was dispersed 1.5 kg of swellable mica ("DM Clean A", made by Topy Kogyo Co., Ltd.), followed by standing for 24 hours. The cloudy supernatant liquid was collected. Thus there was obtained 100 g of swellable mica which is easily dispersible. It was dispersed in 3 liters of water. To the dispersion was added 88.2 g of laurylamine and 48.2 g of conc. hydrochloric acid (36%), followed by stirring at room temperature for 60 minutes. After thorough rinsing, the intercalated mica including water was separated by filtration under reduced pressure using a Buchner funnel. The intercalated mica including water was freeze-dried to remove the water. Thus, intercalated swellable mica containing ammonium ion of laurylamine was given. Finally, it was dispersed in 4.5 kg of dimethylacetamide.

EXAMPLES 1 TO 13

Either of A-1 and A-2 (solution) prepared as mentioned above was combined with any one of B-1 to B-5 (dispersion) prepared as mentioned above according to the formulation shown in Table 1. The resulting mixture was made into film by casting, followed by heating at 300° C. for 2 hours. Thus there was obtained a polyimide film containing a clay mineral.

COMPARATIVE EXAMPLES 1 and 2

Either of A-1 and A-2 (poly(amic acid) solution) prepared as mentioned above was made into a film by casting, followed by heating at 300 C for 2 hours. Thus there was obtained a polyimide film.

COMPARATIVE EXAMPLES 3

A-1 (poly(amic acid) solution) prepared as mentioned above was incorporated with 2% montmorillonite (without intercalation). The resulting mixture was made into film by casting, followed by heating at 300° C. for 2 hours. Thus there was obtained a polyimide film containing plain montmorillonite.

Evaluation of Polyimide Films

The polyimide films obtained in Examples 1 to 13 and Comparative Examples 1 to 3 were tested for content (wt %) of layered clay mineral, water vapor permeability (g·mm/m$^2$·24 h), oxygen permeability (cc·mm/m$^2$·24 h·atm), and thermal expansion coefficient (cm/cm· °C.). The results are shown in Table 1.

It is noted from Table 1 that those films which contain a layered clay mineral have greatly improved gas barrier properties as indicated by low water vapor permeability and oxygen permeability, and also have a low thermal expansion coefficient and a good external appearance. By contrast, those films which are not incorporated with a layered clay mineral are poor in gas barrier properties and have a high thermal expansion coefficient. The film which is incorporated with a plain clay mineral (without intercalation) is poor in external appearance, gas barrier properties, and thermal expansion coefficient.

TABLE 1

| Example No. | Combination | Mixing ratio A:B | Content of clay mineral | Water vapor permeability | Oxygen permeability | Thermal expansion coefficient | Film appearance |
|---|---|---|---|---|---|---|---|
| 1 | A-1 + B-1 | 87.2:12.8 | 2 | 1.0 | 4.4 | $2.7 \times 10^{-5}$ | good |
| 2 | A-1 + B-2 | 99.3:0.7 | 0.1 | 2.1 | 9.5 | $2.9 \times 10^{-5}$ | good |
| 3 | A-1 + B-2 | 81.8:18.2 | 3 | 0.82 | 3.5 | $2.6 \times 10^{-5}$ | good |
| 4 | A-1 + B-2 | 61.5:38.5 | 8 | 0.25 | 1.2 | $2.2 \times 10^{-5}$ | good |
| 5 | A-1 + B-2 | 38.8:61.2 | 18 | 0.03 | 0.2 | $1.5 \times 10^{-5}$ | good |
| 6 | A-1 + B-3 | 72.5:27.5 | 5 | 0.51 | 2.1 | $2.4 \times 10^{-5}$ | good |
| 7 | A-1 + B-4 | 81.8:18.2 | 3 | 0.77 | 3.3 | $2.6 \times 10^{-5}$ | good |
| 8 | A-2 + B-1 | 90.1:9.9 | 2 | 0.92 | 3.8 | $1.8 \times 10^{-5}$ | good |
| 9 | A-2 + B-2 | 77.9:22.1 | 5 | 0.41 | 1.6 | $1.6 \times 10^{-5}$ | good |
| 10 | A-2 + B-4 | 68.1:31.9 | 8 | 0.19 | 0.8 | $1.5 \times 10^{-5}$ | good |
| 11 | A-1 + B-5 | 99.86:0.14 | 0.02 | 2.1 | 9.3 | $2.8 \times 10^{-5}$ | good |
| 12 | A-2 + B-5 | 98.6:1.4 | 0.2 | 1.2 | 4.8 | $2.1 \times 10^{-5}$ | good |
| 13 | A-1 + B-5 | 81.8:18.2 | 3 | 0.1 | 0.8 | $0.8 \times 10^{-5}$ | good |
| (1) | A-1 | — | 0 | 2.5 | 10.0 | $3 \times 10^{-5}$ | good |
| (2) | A-2 | — | 0 | 2.0 | 8.2 | $2 \times 10^{-5}$ | good |
| (3) | A-1 | — | 2 | 2.5 | 9.9 | $2.9 \times 10^{-5}$ | poor |

Comparative Examples are indicated by parenthesized numbers.

What is claimed is:

1. A polyimide composite material which comprises a polyimide-containing resin, organic monoonium ions and a layered clay mineral, said layered clay mineral being intercalated with the organic monoonium ions not bonding with said polyimide and uniformly dispersed in said polyimide.

2. A polyimide composite material as claimed in claim 1, wherein the organic monoonium ion is at least one selected from the group consisting of monoammonium ion, monopyridinium ion, monophosphonium ion, and monosulfonium ion.

3. A polyimide composite material as claimed in claim 1, wherein the organic monoonium ion has a main chain which is a straight or branched carbon chain.

4. A polyimide composite material as claimed in claim 3, wherein the organic monoonium ion has the main chain which is composed of 6 to 20 carbon atoms.

5. A polyimide composite material as claimed in claim 1, wherein the layered clay mineral is at least one selected from the group consisting of: smectite clay minerals comprising montmorillonite, saponite, beidellite, hectorite, and stevensite; vermiculite; halloysite; and swellable mica.

6. A polyimide composite material as claimed in claim 1, wherein the layered clay mineral has a cation exchange capacity of 50 to 300 meq/100 g.

7. A polyimide composite material as claimed in claim 1, wherein the intercalated layered clay mineral and the polyimide are mixed in a ratio of 0.01 to 50 parts by weight (for the former) to 50 to 99.99 parts by weight (for the latter).

8. A polyimide composite material as claimed in claim 1, wherein the intercalated layered clay mineral is dispersed such that individual layers are separated from one another at the molecular level.

9. A polyimide composite material as claimed in claim 8, wherein at least 50% of the intercalated layered clay mineral is dispersed, with individual layers or groups of less than 5 layers on average orienting parallel to one another or randomly or both without forming a mass.

10. A polyimide composite material as claimed in claim 1, which further contains at least one component selected from the group consisting of resins other than polyimide, pigments, dyes, glass fiber, metal fiber, metal flake, heat stabilizers, antioxidants, UV light absorbers, light stabilizers, lubricants, plasticizers, antistatic agents, and flame retardants.

11. A polyimide composite material as claimed in claim 1, wherein said organic monoonium ion has only one onium group as a functional group for bonding.

12. A polyimide composite material as claimed in claim 1, wherein said organic monoonium ion is an alkylmonoonium ion.

13. A polyimide composite material as claimed in claim 12, wherein said alkylmonoonium ion is an alkylammonium ion.

14. A polyimide composite material as claimed in claim 13, wherein said alkylammonium ion is an alkylamine ion.

15. A polyimide composite material as claimed in claim 14, wherein said alkylamine ion is at least one selected from the group consisting of laurylamine ion, myristylamine ion, palmitylamine ion and stearylamine ion.

16. A process for producing a polyimide composite material which comprises the steps of:
   intercalating a layered clay mineral with organic monoonium ions having only one onium group as a functional group for bonding in a protic polar solvent,
   adding, by mixing, the intercalated clay mineral from which the protic polar solvent is removed, to a solution obtained by dissolving a monomer or prepolymer for polyimide in an aprotic polar solvent,
   removing the aprotic polar solvent, and
   forming a polyimide.

17. A process for producing a polyimide composite material as claimed in claim 16, said protic polar solvent comprises at least one member selected from the group consisting of water, methanol, ethanol, propanol, isopropanol, ethylene glycol, 1,4-butanediol, and glycerin.

18. A process for producing a polyimide composite material as claimed in claim 16, wherein the monomer for polyimide comprises at least one dianhydride selected from the group consisting of pyromellitic dianhydride, 3,3', 4,4'-biphenyltetracarboxylic dianhydride, and 3,3', 4,4'-benzophenonetetracarboxylic dianhydride, and at least one diamine selected from the group consisting of 4,4'-diaminodiphenyl ether, 3,4'-diaminodiphenyl ether, and *p*-phenylenediamine.

19. A process for producing a polyimide composite material as claimed in claim 16, wherein said solution is a solution of poly(amic acid).

20. A process for producing a polyimide composite material as claimed in claim 16, wherein said aprotic polar solvent comprises at least one amide-type solvent selected from the group consisting of N,N-dimethylacetamide, N-methylpyrrolidone, N,N-dimethylformamide, and 1,3-dimethylimidazolidinone.

* * * * *

UNITED STATES PATENT AND TRADEMARK OFFICE
CERTIFICATE OF CORRECTION

PATENT NO. : 5,164,460
DATED : November 17, 1992
INVENTOR(S) : KAZUHISA YANO, ET AL It is certified that error appears in the above-identified patent and that said Letters Patent is hereby corrected as shown below:

On the title page, under item [30], Foreign Application Priority Data, "1-140372", should read --2-140372--.

Signed and Sealed this

Fifteenth Day of March, 1994

Attest:

BRUCE LEHMAN

Attesting Officer  Commissioner of Patents and Trademarks